(12) United States Patent
Jang et al.

(10) Patent No.: US 9,023,492 B2
(45) Date of Patent: *May 5, 2015

(54) LOW VOLTAGE-DRIVEN ORGANIC ELECTROLUMINESCENCE DEVICE, AND MANUFACTURING METHOD THEREOF

(75) Inventors: Jun-Gi Jang, Daejeon (KR); Sang-Young Jeon, Daejeon (KR); Seong-So Kim, Paju-si (KR); Chang-Hwan Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 241 days.

This patent is subject to a terminal disclaimer.

(21) Appl. No.: 13/129,062

(22) PCT Filed: Nov. 13, 2009

(86) PCT No.: PCT/KR2009/006700
§ 371 (c)(1),
(2), (4) Date: May 12, 2011

(87) PCT Pub. No.: WO2010/056070
PCT Pub. Date: May 20, 2010

(65) Prior Publication Data
US 2011/0215316 A1   Sep. 8, 2011

(30) Foreign Application Priority Data
Nov. 13, 2008   (KR) .................. 10-2008-0112886

(51) Int. Cl.
*H01L 51/54* (2006.01)
*H01L 51/56* (2006.01)
(Continued)

(52) U.S. Cl.
CPC ......... *H01L 51/5088* (2013.01); *H01L 51/0051* (2013.01); *H01L 51/0059* (2013.01);
(Continued)

(58) Field of Classification Search
None
See application file for complete search history.

(56) References Cited

U.S. PATENT DOCUMENTS 6,717,358 B1   4/2004   Liao et al.
6,720,573 B2 *  4/2004   Son et al. .................. 257/40
(Continued)

FOREIGN PATENT DOCUMENTS

JP   2006-332047 A   12/2006
JP   2007-005784   1/2007
(Continued)

OTHER PUBLICATIONS

X Zhou et al., 'Enhanced Hole Into Amorphous Hole Transport Layers of Organic Light Emitting Diodes Using Controlled P-Type Doping', Advanced Functional Materials, vol. 11, No. 4, pp. 310-314, Aug. 31, 2001.
(Continued)

*Primary Examiner* — J. L. Yang
(74) *Attorney, Agent, or Firm* — McKenna Long & Aldridge LLP

(57) ABSTRACT

The present invention provides an organic light emitting device including an organic layer of two or more organic layers including a first electrode, a second electrode and an emission layer disposed between the two electrodes, wherein the organic layer includes a first injection or transport layer including a material having a LUMO energy level of −4 eV or lower and a second hole injection or transport layer including a material having a HOMO energy level of −4 eV or lower and a material having a LUMO energy level of −4 eV or lower, which is in contact with the first hole injection or transport layer and a method for manufacturing the organic light emitting device.

17 Claims, 1 Drawing Sheet

| 1 |
|---|
| 2 |
| 3 |
| 4 |
| 5 |
| 6 |
| 7 |

(51) Int. Cl.
   *H01L 51/50* (2006.01)
   *H01L 51/00* (2006.01)

(52) U.S. Cl.
   CPC ........... *H01L51/006* (2013.01); *H01L 51/0061* (2013.01); *H01L 51/0067* (2013.01); *H01L 51/0072* (2013.01); *H01L 51/5052* (2013.01); *H01L 2251/552* (2013.01); *H01L 2251/558* (2013.01)

(56) References Cited

U.S. PATENT DOCUMENTS

| | | | |
|---|---|---|---|
| 2005/0274961 A1 | 12/2005 | Iou | |
| 2006/0226770 A1 | 10/2006 | Lee et al. | |
| 2006/0240278 A1* | 10/2006 | Hatwar et al. | 428/690 |
| 2006/0279190 A1 | 12/2006 | Nakayama | |
| 2007/0034864 A1 | 2/2007 | Liu | |
| 2007/0077453 A1* | 4/2007 | Sano et al. | 428/690 |
| 2007/0079927 A1 | 4/2007 | Lamansky et al. | |
| 2007/0082226 A1* | 4/2007 | Yu | 428/690 |
| 2010/0289008 A1 | 11/2010 | Jang et al. | |
| 2011/0215316 A1* | 9/2011 | Jang et al. | 257/40 |

FOREIGN PATENT DOCUMENTS

| | | | |
|---|---|---|---|
| JP | 2007-049134 | 2/2007 | |
| KR | 10-2000-0062301 | 10/2000 | |
| KR | 10-2007-0093881 A | 9/2007 | |
| KR | 10-0823443 | 4/2008 | |
| TW | 200541102 A | 12/2005 | |
| TW | 200714689 A | 4/2007 | |
| WO | WO 98/28767 | 7/1998 | |
| WO | 2007/011132 A1 | 1/2007 | |
| WO | 2007/105906 A1 | 9/2007 | |
| WO | 2008010161 A2 | 1/2008 | |
| WO | WO 2008/010161 A2 * | 1/2008 | H01L 51/52 |

OTHER PUBLICATIONS

Meng Fanshun et al.: "Cyanine dye acting both as donor and acceptor in heterojunction photovoltaic devices", Applied Physics Letters, AIP, American Institute of Physics, Melville, NY, US, vol. 82, No. 21, May 26, 2003, pp. 3788-3790, XP012034231.

Office Action of European Patent Office, Dec. 21, 2012.

* cited by examiner

| 1 |
|---|
| 2 |
| 3 |
| 4 |
| 5 |
| 6 |
| 7 |

US 9,023,492 B2

LOW VOLTAGE-DRIVEN ORGANIC ELECTROLUMINESCENCE DEVICE, AND MANUFACTURING METHOD THEREOF

This application is a national stage application of PCT/KR2009/006700, filed on Nov. 13, 2009, which claims priority to Korean Patent Application No. 10-2008-0112886, filed on Nov. 13, 2008, all of which are hereby incorporated by reference in their entirety.

TECHNICAL FIELD

The present invention relates to an organic light emitting device having low operating voltage and a method for manufacturing the same.

BACKGROUND ART

An organic light emitting device is an electric device that emits light through current by applied voltage. Tang et al. reported an organic light emitting device having a good characteristic in a treatise [Applied Physics Letters 51, p. 913, 1987]. Further, an organic light emitting device using a polymeric material while using a structure of the organic light emitting device disclosed in the treatise had been also developed.

The key point of the related art is to allow different organic layers to share roles for performing processes in which the organic light emitting device can emit light, such as electron injection, electron transport, formation of optical exciton and generation of light. Therefore, in recent years, as shown in FIG. 1, has been used an organic light emitting device including a positive electrode 7, a hole injection layer 6, a hole transport layer 5, an emission layer 4, an electron transport layer 3, an electron injection layer 2 and a negative electrode 1 or an organic light emitting device having a segmented structure constituted by more layers.

Have been made studies on doping the hole injection layer, the hole transport layer, the electron transport layer and the electron injection layer in the structure of the organic light emitting device with various different materials in order to improve mobility of the existing organic material (Publication of Japanese Patent Application No. 2000-196140, Treatise [Applied Physics Letters, 73, p. 729-731, 1998], Treatise [Applied Physics Letters, 72, pp. 2147-2149, 1998], U.S. Pat. No. 5,093,698, and International Unexamined Publication No. WO01/67825).

In the documents, a device having high efficiency is implemented by merely increasing the mobility of the charge transport layer or the charge injection layer through doping. For example, as disclosed in International Unexamined Publication No. WO01/67825, when the hole transport layer is P-doped with a stable acceptor type organic molecular material having a high molecular weight of 200 g/mol or higher (low doping concentration: 1:110~10000), hole mobility is increased as compared with the opposite case. Similarly, it is disclosed that when the electron transport layer is n-doped with a stable donor type molecular having a high molecular mass, an effect similar to the above can be obtained.

Meanwhile, since the quantity of electrons that are injected into the emission layer from the electron transport layer smaller than the quantity of holes that are injected into the emission layer from the hole transport layer in the organic light emitting device at present, the efficiency of the device may be increased by decreasing the mobility of the hole transport layer (Applied Physics Letters, 86, 203507, 2005).

The document discloses an example in which a hole transport layer [N,N'-bis-(1-naphthyl)-N,N'-diphenyl-1,1'-biphenyl-4,4'-diamine (NPB), HOMO: −5.5 eV, LUMO: −2.4 eV] having a large energy band gap is doped with a hole injection layer [copper phthalocyanine (CuPC), HOMO: −5.1 eV, LUMO: −3 eV] having a small energy band gap. The increase in efficiency of the device results from increasing the efficiency by adjusting a ratio between the holes and the electrons injected into the emission layer by trapping the holes by using a highest occupied molecular orbital energy level of CuPC.

On the other hand, Patent (KR 1-0823443) disclosed the fact in that a high-efficiency organic light emitting device can be obtained when the hole injection and/or transport layer is formed by using a material having a LUMO energy level of −4 eV or lower in addition to a material having a HOMO energy level of −4 eV or lower originally used as a hole injection and/or transport material. However, in the related art, it is difficult to achieve low operating voltage when the thickness of the organic layer is large.

An effect resulting from decreasing the operating voltage of the organic light emitting device may increase energy efficiency and has been known as a matter which is essential to form an optical resonant structure particularly required in actual application of the organic light emitting device. The known formation of the optical resonant structure can be classified into (A) application of an internal resonant structure [ref(Journal of applied physics v97 093102)], (B) application of an MIM resonant structure [ref(Journal of applied physics v97 103112)], and (C) application of an external resonant structure [ref(Journal of applied physics v93 p19), (Journal of applied physics v86 p2407), and (Journal of applied physics v80 p6954)]. Among them, in the case of (A) and (B), the present invention has been made in an effort to increase energy efficiency of the entire organic light emitting device and partially solve a limitation related to voltage generated in forming the optical resonant structure required in actual application by providing a technique of decreasing the operating voltage of the organic light emitting device.

DISCLOSURE

Technical Problem

The inventors had found the fact in that an organic light emitting device having low operating voltage can be acquired by using, as a hole injection or transport organic layer in the organic light emitting device, an organic layer including a material having a LUMO energy level of −4 eV or lower together with a material having a HOMO energy level of −4 eV or lower originally used as a hole injection and/or transport material and in addition, using a layer including a material having a LUMO energy level of −4 eV or lower, which is in contact with the organic layer. Therefore, an object of the present invention is to provide an organic light emitting device having low operating voltage and a method for manufacturing the same.

Technical Solution

An exemplary embodiment of the present invention provides an organic light emitting device including an organic layer of two or more organic layers including a first electrode, a second electrode and an emission layer disposed between the two electrodes, wherein the organic layer includes a first injection or transport layer including a material having a LUMO energy level of −4 eV or lower and a second hole injection or transport layer including a material having a HOMO energy level of −4 eV or lower and a material having a LUMO energy level of −4 eV or lower, which is in contact with the first hole injection or transport layer.

Another exemplary embodiment of the present invention provides a method for fabricating an organic light emitting device including preparing a first electrode, forming two or more organic layers including an emission layer on the first electrode and forming a second electrode on the organic layer. The forming of the organic layer includes forming a first hole injection or transport layer including a material having a LUMO energy level of −4 eV or lower and forming a second hole injection or transport layer including a material having a HOMO energy level of −4 eV or lower and the material having the LUMO energy level of −4 eV or lower to be in contact with the first hole injection or transport layer.

Yet another exemplary embodiment of the present invention provides a stacked organic light emitting device including a first electrode, a second electrode and at least two light emitting units interposed between the two electrodes wherein the light emitting unit includes an emission layer, a first hole injection or transport layer including a material having a LUMO energy level of −4 eV or lower and a second hole injection or transport layer including a material having a HOMO energy level of −4 eV or lower and a material having a LUMO energy level of −4 eV or lower, which is in contact with the first hole injection or transport layer.

Advantageous Effects

In the present invention, it is possible to provide an organic light emitting device having low operating voltage by using a structure in which a layer including a material having a HOMO energy level of −4 eV or lower and a material having a LUMO energy level of −4 eV or lower is provided on a layer including a material having a LUMO energy level of −4 eV or lower as a hole injection or transport layer of the organic light emitting device.

DESCRIPTION OF DRAWINGS

FIG. 1 is a cross-sectional view showing the structure of an organic light emitting device.

BEST MODE

Hereinafter, the present invention will be described in detail.

The present invention includes a first hole injection or transport layer including a material having a LUMO energy level of −4 eV or lower and a second hole injection or transport layer including a material having a LUMO energy level of −4 eV or lower in addition to a material having a HOMO energy level of −4 eV or lower, which is in contact with the first hole injection or transport layer, as an organic layer.

In general, an organic light emitting device is constituted by various functional layers, e.g., a positive electrode, a hole injection layer, a hole transport layer, an emission layer, an electron injection layer, an electron transport layer, or a negative electrode in order to acquire a high-efficiency characteristic. Further, in usual, operating voltage depends on injection characteristics of holes or electrons on interfaces among the layers described above or generation degrees of the holes and the electrons on the interfaces and carrier mobility of the holes or the electrons on the layers. In particular, the injection characteristics of the holes or electrons on the interfaces among the layers or the generation degrees of the holes and the electrons on the interfaces play very important roles in the organic light emitting device. For example, the interface between the positive electrode and the hole injection layer and the interface between the hole injection layer and the hole transport layer are very important in an operating voltage characteristic considering the layers between the positive electrode and the emission layer. If the holes are not smoothly injected among the interfaces, it causes the operating voltage to be increased and in particular, as the thickness of the hole injection layer or the hole transport layer increases, the operating voltage may be rapidly increased.

Further, the injection characteristics of the holes or the electrons are improved as an electric field applied to the interfaces is large and as the thickness of the hole injection layer or the hole transport layer increases, the electric field decreases, such that the operating voltage increases.

Due to these characteristics, when only the hole injection or transport layer is used, which includes the material having the LUMO energy level of −4 eV or lower in addition to the material having the HOMO energy level of −4 eV or lower, the high-efficiency organic light emitting device may be acquired by forming an optical resonant structure, but in this case, the operating voltage may be increased because the holes or electrons are not smoothly injected on the interfaces or the thickness increases.

Accordingly, the present invention includes a first hole injection or transport layer including the material having the LUMO energy level of −4 eV or lower and a second hole injection or transport layer including the material having the HOMO energy level of −4 eV or lower and the material having the LUMO energy level of −4 eV or lower between the electrode and the emission layer, to improve the hole injection characteristic on the interface between the electrode and the hole injection or transport layer, thereby providing an organic light emitting device having high efficiency even at low voltage regardless of the increase of the operating voltage by the increase in the thickness of the hole injection and transport layer.

Further, when the present invention includes a first hole injection or transport layer including the material having the LUMO energy level of −4 eV or lower and a second hole injection or transport layer including the material having the HOMO energy level of −4 eV or lower and the material having the LUMO energy level of −4 eV or lower between the electrode and the emission layer and uses the material having the HOMO energy level of −4 eV or lower as the hole transport layer or an electron blocking layer between the second hole injection or transport layer and the emission layer, the hole injection characteristic on the interface of each layer is further improved, thereby maximally suppressing a possibility to increase the operating voltage between the electrode and the emission layer.

In the present invention, the HOMO energy level (alternatively, ionization potential (IP)) and LUMO (alternatively, electron affinity (EA)) energy level can be acquired by an apparatus or a calculation method known in the art when an organic or inorganic material is measured in a film type. For example, the HOMO energy level can be measured by using an ultra-violet photoemission spectroscopy (UPS) or an AC-2 or AC-3 equipment made by Riken Keiki (Japan). Further, the LUMO energy level can be measured by using an inverse photoemission spectroscopy (IPES) or calculated by measuring the HOMO energy level and thereafter, subtracting an optical band gap from the measured HOMO energy level.

In the second hole injection or transport layer including the material having the HOMO energy level of −4 eV or lower and the material having the LUMO energy level of −4 eV or lower, the material having the HOMO energy level of −4 eV or lower that is used as the hole injection or transport material in the related art may be used without limitation. The material having the HOMO energy level of −4 eV or lower preferably has a HOMO energy level of −9 eV or higher.

As the hole injection or transport material, an organic material having one or two or more functional groups selected from the group consisting of an amine group, a carbazole group and a thiophene group is preferably used. The material having the HOMO energy level of −4 eV or lower is preferably an aryl amine compound including one or more nitrogen atoms, more specifically, tri(terphenyl-4-il)amine(p-TTA)(−5.6 eV), N,N'-bis-(1-naphthyl)-N,N'-diphenyl-1,1'-biphenyl-4,4'-diamine(NPB)(−5.5 eV), N, N'-diphenyl-N,N'-(3-methylphenyl)-1,1'-biphenyl-4,4'-diamine(TPD) (−5.2 eV), m-tris(diphenylamino)triphenylamine(m-TDATA) (−5.1 eV) and the like, but is not limited only thereto.

In the second hole injection or transport layer including the material having the HOMO energy level of −4 eV or lower and the material having the LUMO energy level of −4 eV or lower, the material having the LUMO energy level of −4 eV or lower can control the conductivity of the hole injection or transport material of the organic light emitting device through the LUMO energy level. Specifically, the material has the LUMO energy level of −4 eV or lower serves to increase the conductivity of the second hole injection or transport layer which is in contact with the first hole injection or transport layer including the material having the LUMO energy level of −4 eV or lower. Therefore, it is possible to improve low voltage operation of the device.

The first hole injection or transport layer including the material having the LUMO energy level of −4 eV or lower is provided in contact with the second hole injection or transport layer including the material having the HOMO energy level of −4 eV or lower and the material having the LUMO energy level of −4 eV or lower.

In the first hole injection or transport layer and the second hole injection or transport layer, as long as the LUMO energy level of the material having the LUMO energy level of −4 eV or lower is −4 eV or lower, a type thereof is not particularly limited. The material having the LUMO energy level of −4 eV or lower more preferably has a HOMO energy level of −5 eV or lower. Further, the material having the LUMO energy level of −4 eV or lower preferably has a LUMO energy level of −9 eV or higher. Detailed examples of the material having the LUMO energy level of −4 eV or lower include 2,3,5,6-tetrafluoro-7,7,8,8-tetracyanoquinodimethane (F4TCNQ), fluorine-substituted 3,4,9,10-perylene tetracarboxylic dianhydride (PTCDA), cyano-substituted PTCDA, naphthalene tetracarboxylic dianhydride (NTCDA), fluorine-substituted NTCDA, cyano-substituted NTCDA, hexanitrilhexaazatriphenylene (HAT) and the like, but the material is not limited only thereto.

The materials having the LUMO energy level of −4 eV or lower included in each of the first hole injection or transport layer and the second hole injection or transport layer may be the same type or different types.

The first hole injection or transport layer and the second hole injection or transport layer which is in contact therewith may be disposed between the first electrode and the emission layer. In this case, it is preferable that the first hole injection or transport layer is disposed at the side of the first electrode and the second hole injection or transport layer is disposed at the side of the emission layer, but they may be disposed at the opposite sides thereto.

An additional organic material, e.g., one or more layers including the material having the LUMO energy level of −4 eV or lower or one or more layers including the material having the HOMO energy level of −4 eV or lower may be included between stacking structures such as the first electrode and the first hole injection or transport layer and the second hole injection or transport layer. The material having the HOMO energy level of −4 eV or lower, which is used as the hole injection or transport material in the related art may be used without limitation. Further, all structures ([International Publication No. WO01/67825] [Applied Physics letters, 86, 203507, 2005]) capable of smoothly injecting or transporting charges into or to the organic layer from the first electrode by the existing various methods may be included. Further, an additional organic layer may be provided even between the stacking structure of the first hole injection or transport layer and the second hole injection or transport layer and the emission layer.

In the second hole injection or transport layer of the organic light emitting device according to the present invention, a ratio between the material having the HOMO energy level of −4 eV or lower and the material having the LUMO energy level of −4 eV or lower is not particularly limited and may be used as a ratio when operating voltage decreases as compared with a case in which each material is independently used. The mixing ratio may be selected by a person of ordinary skill in the art according to types of the mixed materials, a fabrication or operating condition of the device and the like.

As a method for forming the first hole injection or transport layer and the second hole injection or transport layer, a method known in the art can be used without particular limitation. For example, the first and second injection or transport layers may be formed by coating the materials through a solution process or depositing the materials. The coating method includes spin coating, deep coating, doctor blading, screen printing, inkjet printing, or thermal patterning, but is not limited thereto.

In the organic light emitting device according to the present invention, the thickness of the first hole injection or transport layer is preferably 0.1 to 100 nm and the thickness of the second hole injection or transport layer is preferably 1 to 1000 nm.

The organic light emitting device according to the present invention may have a structure known in the art, except for the structure including the stacking structure of the first hole injection or transport layer and the second hole injection or transport layer.

In the organic light emitting device according to the present invention, the first or second hole injection or transport layer may additionally include an inorganic material. The inorganic material is preferably metal or metal oxide. A work function of the inorganic material is 6 eV or lower and preferably 2.5 eV or higher and 6 eV or lower. Detailed examples of the inorganic material having the work function of 6 eV or lower include Au(5.1 eV), Pt(5.6 eV), Al(4.2 eV), Ag(4.2 eV), Li(2.9 eV) and the like.

The organic light emitting device according to the present invention has a structure including a first electrode, a second electrode and an organic layer interposed between the two electrodes and the organic layer may include only the first hole injection or transport layer having the material having the LUMO energy level of −4 eV or lower and the second hole injection or transport layer including the material having the HOMO energy level of −4 eV or lower and the material having the LUMO energy level of −4 eV or lower, other than an emission layer and may include an additional organic layer, e.g., one or more layers selected from an electron transport layer, an electron injection layer, a hole or electron blocking layer and a buffer layer. Further, in the present invention, the first electrode may be a hole injection electrode and the second electrode may be an electron injection electrode and vice versa.

For example, the organic light emitting device of the present invention may have a structure including a substrate, the hole injection electrode, the first hole injection or transport layer, the second hole injection or transport layer, the emission layer, the electron transport layer and the electron injection electrode that are stacked in sequence. The organic light emitting device having the structure is generally called a normal structure organic light emitting device and the present invention is not limited thereto and includes even an inverted structure organic light emitting device. That is, the organic light emitting device of the present invention may have a structure in which the substrate, the electron injection electrode, the electron transport layer, the emission layer, the hole injection and/or transport layer, and the hole injection electrode are stacked in sequence.

A method for fabricating an organic light emitting device according to the present invention includes preparing a first electrode, forming two or more organic layers including an emission layer on the first electrode, and forming a second electrode on the organic layer. The forming of the organic layer includes forming a first hole injection or transport layer including a material having a LUMO energy level of −4 eV or lower and forming a second hole injection or transport layer including a material having a HOMO energy level of −4 eV or lower and the material having the LUMO energy level of −4 eV or lower to be in contact with the first hole injection or transport layer.

In the fabricating method of the organic light emitting device according to the present invention, the organic light emitting device may be fabricated by using a method and a material known in the art, except that the first hole injection or transport layer and the second hole injection or transport layer are formed to be in contact with each other.

For example, the organic light emitting device according to the present invention may be fabricated by forming a positive electrode by depositing metal or metal oxide having conductivity, or an alloy thereof on a substrate by using a physical vapor deposition (PVD) method such as sputtering or e-beam evaporation, forming an organic layer thereon, and depositing a material which can be used as a negative electrode thereon. In addition to the method, the organic light emitting device may be fabricated by depositing a negative material, an organic layer, and a positive material on a substrate in sequence in order to fabricate the inverted structure organic light emitting device as described above.

In the organic light emitting device according to the present invention, the organic layer may be fabricated by the smaller number of layers through not the deposition method but a solvent process, e.g., a method such as spin coating, deep coating, doctor blazing, screen printing, inkjet printing, or thermal patterning by using various polymeric materials.

In the electrode of the organic light emitting device according to the present invention, it is preferable that a hole injection electrode material is generally a material having a large work function so as to smoothly inject holes into the organic layer. Detailed examples of the hole injection electrode material which can be used in the present invention include metal such as vanadium, chrome, copper, zinc, and gold or alloys thereof, metal oxide such as zinc oxide, indium oxide, indium tin oxide (ITO), and indium zinc oxide (IZO), a combination of metal and oxide such as ZnO:Al or SnO:Sb, and a conductive polymer such as poly(3-methylthiophene), poly[3,4-(ethylene-1,2-dioxy)thiophene] (PEDT), polypyrrole, and polyaniline, but are not particularly limited thereto.

In the electrode of the organic light emitting device according to the present invention, it is preferable that an electron injection electrode material is generally a material having a small work function so as to easily inject electrons into the organic layer. Detailed examples of the negative material include metal such as magnesium, calcium, sodium, postassium, titanium, indium, yttrium, lithium, gadolinium, aluminum, silver, tin, and plumbum, or alloys thereof, and a multilayer-structure material such as LiF/Al or LiO, but are not limited thereto.

The emission material that can emit light of a visible-light band by receiving holes and electros from the hole transport layer and the electron transport layer, respectively, and coupling the holes and electrons to each other is preferably a material having high quantum efficiency with respect to fluorescence or phosphorescence. Detailed examples of the emission material include 8-hydroxy-quinoline aluminum complex ($Alq_3$), a carbazole-based compound, a dimerized styryl compound, BAlq, a 10-hydroxybenzo quinoline-metal compound, benzoxazole, benzthiazole and benzimidazole-based compounds, poly(p-phenylenevinylene) (PVV)-based polymer, a Spiro compound, polyfluorene, rubrene, phosphorescence host CBP[[4,4'-bis(9-carbazolyl)biphenyl], and the like, but are not limited thereto.

Further, the emission material may additionally include phosphorescent dopant or fluorescent dopant in order to improve fluorescent or phosphorescent characteristic. Detailed examples of the phosphorescent dopant include ir(ppy)3[fac tris(2-phenylpyridine) iridium], F2Irpic[iridium (III)bis(4,6,-di-fluorophenyl-pyridinato-N,C2) picolinate], or the like. As the fluorescent dopant, materials known in the art may be used.

As the electron transport material, which can receive electrons from the electron injection electrode and transport the electrons to the emission layer well, a material having high mobility to electrons is suitable. Detailed examples thereof include an Al complex of 8-hydroxyquinoline, a complex including $Alq_3$, an organic radical compound, a hydroxyflavone-metal complex, and the like, but are not limited thereto.

Further, the present invention as a stacked organic light emitting device including a first electrode, a second electrode, and at least two light emitting units interposed the two electrodes provides a stacked type organic light emitting device in which the light emitting unit includes an emission layer, a first hole injection or transport layer including a material having a LUMO energy level of −4 eV or lower, and a second hole injection or transport layer including a material having a HOMO energy level of −4 eV or lower and a material having a LUMO energy level of −4 eV or lower, which is in contact with the first hole injection or transport layer. An intermediate conductive layer or a charge generating layer may be provided between the light emitting units. The intermediate conductive layer or charge generating layer may be a single layer and a stacking structure constituted by two or more layers and may have a material and a structure known in the art.

MODE FOR INVENTION

Hereinafter, the present invention is described in more detail through examples, but the examples described below are used to illustrate the present invention and the scope of the present invention is not limited thereby.

Example 1

A transparent electrode (indium tin oxide) as a hole injection electrode was deposited on a glass substrate with a thickness of 100 nm and subjected to oxygen plasma processing under a pressure of 30 mtorr and 80 w for 30 sec. Hexaazatriphenylenehexacarbonitril (LUMO: approximately −5.5 to −6 eV) [cp10] was deposited with a thickness of 1 nm by applying heat thereonto in a vacuum state to form a first hole injection or transport layer. N,N'-bis-(1-naphthyl)-N,N'-diphenyl-1,1'-biphenyl-4,4'-diamine(NPB)[cp3] (HOMO: approximately −5.5 eV) and [cp10] were deposited thereon with a thickness of 40 nm as a second hole injection or transport layer by adjusting a doping concentration to a volume ratio of 1:0 to 0:1 as shown in a table below. NPB was deposited thereon with a thickness of 30 nm as a hole transport and electron blocking layer and [cp1] and [cp2] were deposited with a thickness of 20 nm as an emission layer thereon. Subsequently, tris(8-hydroxyquinolino)aluminum ($Alq_3$) was deposited thereon with a thickness of 20 nm as an electron transport and injection layer, LiF was deposited thereon with a thickness of 1 nm as an electron injection layer, and aluminum (Al) was deposited thereon with a thickness of 150 nm as an electron injection electrode to thereby fabricate an organic light emitting device.

A characteristic of a device fabricated under current density of 50 mA/cm$^2$ is shown in the following table.

| Volume ratio (cp3:cp10) | Operating voltage (v) | Operating voltage variations (%) |
|---|---|---|
| 1:0 | 7.69 | 0 |
| 19:1 | 7.72 | −0.4 |
| 9:1 | 7.42 | −3.5 |
| 4:1 | 6.35 | −17.4 |
| 3:2 | 5.68 | −26.1 |
| 2:3 | 5.75 | −25.2 |
| 1:4 | 5.88 | −23.5 |
| 0:1 | 6.12 | −20.4 |

(cp3:cp10 = x:y) structure operating voltage = A, (cp3:cp10 = 1:0) structure operating voltage = B
Operating voltage variations (%) = (A − B)/B*100

In the above table, it can be seen that the organic light emitting device according to the present invention is effective in voltage operating and it can be seen that optimized operating voltage is a volume ratio of approximately 50:50.

Example 2

The organic light emitting device was fabricated by the same method as Example 1, except that [cp3] and [cp10] were deposited with a thickness of 30 to 150 nm as a second hole injection or transport layer by adjusting a doping concentration of [cp3] and [cp10] to a volume ratio of 1:1, in Example 1.

A characteristic of a device fabricated under current density of 50 mA/cm$^2$ is shown in the following table.

| [cp3]:[cp10] thickness (nm) | Voltage (v) | dV/dL ($10^{-3}$ V/nm) | Operating voltage variations (%) |
|---|---|---|---|
| 30 | 5.55 | N/A | 0 |
| 60 | 5.57 | 0.7 | 0.36 |
| 90 | 5.62 | 1.7 | 1.26 |
| 120 | 5.69 | 2.3 | 2.52 |
| 150 | 5.75 | 2.0 | 3.6 |

(cp3:cp10 = xx nm) structure operating voltage = A, (cp3:cp10 = 30 nm) structure operating voltage = B
Operating voltage variations (%) = (A − B)/B*100 dV/dL can be analyzed by primary approximation of operating voltage per unit thickness of a configured organic layer and is a primary performance index claimed in the present invention. In particular, it can be seen that operating voltage which is approximately 15 times lower is applied as compared to the case where [cp3] is independently used as the hole injection or transport layer as Comparative Examples 2, 3, and 4 described below.

Example 3

The organic light emitting device was fabricated by the same method as Example 1, except that [cp4] and [cp10] were deposited with a thickness of 40 nm as the second hole injection or transport layer by adjusting a doping concentration of [cp4] (HOMO; −5.33 eV) and [cp10] (LUMO: approximately −5.5 to −6 eV to a volume ratio of 1:0 to 1:4, in Example 1.

A characteristic of a device fabricated under current density of 50 mA/cm$^2$ is shown in the following table.

| [cp4]:[cp10] Volume ratio | Voltage (v) | Operating voltage variations (%) |
|---|---|---|
| 1:0 | 6.72 | 0 |
| 4:1 | 6.31 | −6.1 |
| 5:5 | 5.2 | −22.6 |
| 1:4 | 5.84 | −14.4 |

(cp4:cp10 = x:y) structure operating voltage = A, (cp4:cp10 = 1:0) structure operating voltage = B
Operating voltage variations (%) = (A − B)/B*100

Example 4

The organic light emitting device was fabricated by the same method as Example 1, except that [cp5] and [cp10] were deposited with a thickness of 40 nm as the second hole injection or transport layer by adjusting a doping concentration of [cp5] (HOMO: −5.3 eV) and [cp10] (LUMO: approximately −5.5 to −6 eV) to a volume ratio of 1:0 to 1:4, in Example 1.

A characteristic of a device fabricated under current density of 50 mA/cm$^2$ is shown in the following table.

| [cp5]:[cp10] Volume ratio | Voltage (v) | Operating voltage variations (%) |
|---|---|---|
| 1:0 | 7.52 | 0 |
| 4:1 | 7.01 | −6.78 |
| 5:5 | 6.4 | −14.9 |
| 1:4 | 6.55 | −12.9 |

(cp5:cp10 = x:y) structure operating voltage = A, (cp5:cp10 = 1:0) structure operating voltage = B
Operating voltage variations (%) = (A − B)/B*100

Example 5

The organic light emitting device was fabricated by the same method as Example 1, except that [cp6] and [cp10] are deposited with a thickness of 40 nm as the second hole injection or transport layer by adjusting a doping concentration of [cp4] (HOMO: −5.2 eV) and [cp10] (LUMO: approximately −5.5 to −6 eV) to a volume ratio of 1:0 to 1:4, in Example 1.

A characteristic of a device fabricated under current density of 50 mA/cm$^2$ is shown in the following table.

| [cp6]:[cp10] Volume ratio | Voltage (v) | Operating voltage variations (%) |
|---|---|---|
| 1:0 | 7.62 | 0 |
| 4:1 | 6.43 | −15.6 |
| 5:5 | 5.78 | −24.1 |
| 1:4 | 6.13 | −19.5 |

(cp6:cp10 = x:y) structure operating voltage = A, (cp6:cp10 = 1:0) structure operating voltage = B
Operating voltage variations (%) = (A − B)/B*100

Example 6

The organic light emitting device was fabricated by the same method as Example 1, except that [cp7] and [cp10] were deposited with a thickness of 40 nm as the second hole injection or transport layer by adjusting a doping concentration of [cp7] (HOMO: −5.4 eV) and [cp10] (LUMO: approximately −5.5 to −6 eV) to a volume ratio of 1:0 to 1:4, in Example 1.

A characteristic of a device fabricated under current density of 50 mA/cm² is shown in the following table.

| [cp7]:[cp10] Volume ratio | Voltage (v) | Operating voltage variations (%) |
|---|---|---|
| 1:0 | 8.01 | 0 |
| 4:1 | 7.42 | −7.36 |
| 5:5 | 6.49 | −19 |
| 1:4 | 6.98 | −12.9 |

(cp7:cp10 = x:y) structure operating voltage = A, (cp7:cp10 = 1:0) structure operating voltage = B
Operating voltage variations (%) = (A − B)/B*100

Example 7

The organic light emitting device was fabricated by the same method as Example 1, except that [cp8] and [cp10] were deposited with a thickness of 40 nm as the second hole injection or transport layer by adjusting a doping concentration of [cp8] (HOMO: −5.4 eV) and [cp10] (LUMO: approximately −5.5 to −6 eV) to a volume ratio of 1:0 to 1:4, in Example 1.

A characteristic of a device fabricated under current density of 50 mA/cm² is shown in the following table.

| [cp8]:[cp10] Volume ratio | Voltage (v) | Operating voltage variations (%) |
|---|---|---|
| 1:0 | 7.81 | 0 |
| 4:1 | 6.12 | −21.6 |
| 5:5 | 5.48 | −30 |
| 1:4 | 5.84 | −25.2 |

(cp8:cp10 = x:y) structure operating voltage = A, (cp8:cp10 = 1:0) structure operating voltage = B
Operating voltage variations (%) = (A − B)/B*100

Example 8

The organic light emitting device was fabricated by the same method as Example 1, except that the first hole injection or transport layer was formed by depositing [cp9] (LUMO: approximately −5.0 to −5.3 eV) on a transparent electrode with a thickness of 1 nm and [cp3] and [cp9] were deposited thereon with a thickness of 40 nm as the second hole injection or transport layer by adjusting a doping concentration of [cp3] (HOMO: approximately −5.5 eV) and [cp9] (LUMO: approximately −5.0 to −5.3 eV) to a volume ratio of 1:0 to 1:4, in Example 1.

A characteristic of a device fabricated under current density of 50 mA/cm² is shown in the following table.

| [cp3]:[cp9] Volume ratio | Voltage (v) | Operating voltage variations (%) |
|---|---|---|
| 1:0 | 9.24 | 0 |
| 4:1 | 8.56 | −7.35 |
| 5:5 | 7.98 | −13.6 |
| 1:4 | 8.41 | −9 |

(cp3:cp9 = x:y) structure operating voltage = A, (cp3:cp9 = 1:0) structure operating voltage = B
Operating voltage variations (%) = (A − B)/B*100

Example 9

The organic light emitting device was fabricated by the same method as Example 1, except that the first hole injection or transport layer was formed by depositing [cp10] (LUMO: approximately −5.5 to −6 eV) on the transparent electrode with a thickness of 1 nm, [cp3] (HOMO: approximately −5.5 eV) was deposited thereon with a thickness of 1 nm and [cp10] (LUMO: approximately −5.5 to −6 eV) was deposited thereon with a thickness of 1 nm as the second hole injection or transport layer, and [cp3] and [cp10] were deposited thereon with a thickness of 30 nm as the hole injection and hole transport layers by adjusting a doping concentration of [cp3] (HOMO: approximately −5.5 eV) and [cp10] (LUMO: approximately −5.5 to −6 eV to a volume ratio of 1:1, in Example 1.

Operating voltage of a device fabricated under current density of 50 mA/cm² is 5.61 V.

Comparative Example

Comparative Example 1

The organic light emitting device was fabricated by the same method as Example 1, except that [cp3] and [cp10] were deposited directly on the transparent electrode (indium tin oxide) with a thickness of 40 nm as the hole injection or transport layer by adjusting a doping concentration of [cp3] (HOMO: approximately −5.5 eV) and [cp10] (LUMO: approximately −5.5 to −6 eV) to a volume ratio of 1:0 to 1:4 and NPB was deposited thereon with a thickness of 40 nm as the hole transport and electron blocking layer, in Example 1.

A characteristic of a device fabricated under current density of 50 mA/cm² is shown in the following table.

| Volume ratio [cp3]:[cp10] | Voltage (v) | Operating voltage variations (%) |
|---|---|---|
| 1:0 | 6.36 | 0 |
| 4:1 | 8.92 | 40.2 |
| 3:2 | 12.41 | 95.12 |
| 2:3 | 12.68 | 99.37 |
| 1:4 | 9.66 | 51.88 |

(cp3:cp10 = x:y) structure operating voltage = A, (cp3:cp10 = 1:0) structure operating voltage = B
Operating voltage variations (%) = (A − B)/B*100

Comparative Example 2

The organic light emitting device was fabricated by the same method as Example 1, except that [cp3] (HOMO: approximately −5.5 eV) was deposited with a thickness of 0 to 120 nm as the hole injection or transport layer in Example 1.

A characteristic of a device fabricated under current density of 50 mA/cm² is shown in the following table.

| [cp3] Thickness (nm) | Voltage (v) | dV/dL (10⁻³ V/nm) | Operating voltage variations (%) |
|---|---|---|---|
| 0 | 6.7 | N/A | 0 |
| 30 | 7.66 | 32 | 14.3 |
| 60 | 8.57 | 30 | 27.9 |
| 90 | 9.48 | 30 | 41.49 |
| 120 | 10.47 | 33 | 56.3 |

(cp3 = XX nm) structure operating voltage = A, (cp3 = 0 nm) structure operating voltage = B
Operating voltage variations (%) = (A − B)/B*100

Comparative Example 3

The organic light emitting device was fabricated by the same method as Example 1, except that [cp3] (HOMO: approximately −5.5 eV) was deposited directly on the transparent electrode (indium tin oxide) with a thickness of 40 nm to 150 nm as the hole injection or transport layer and NPB was deposited thereon with a thickness of 40 nm as the hole transport and electron blocking layer, in Example 1.

A characteristic of a device fabricated under current density of 50 mA/cm² is shown in the following table.

| [cp3] Thickness (nm) | Voltage (v) | dV/dL (10⁻³ V/nm) | Operating voltage variations (%) |
|---|---|---|---|
| 40 | 6.13 | N/A | 0 |
| 90 | 7.05 | 31 | 15 |
| 120 | 7.42 | 12 | 21 |
| 150 | 8.36 | 30 | 36.4 |

(cp3 = XX nm) structure operating voltage = A, (cp3 = 40 nm) structure operating voltage = B
Operating voltage variations (%) = (A − B)/B*100

Comparative Example 4

The organic light emitting device was fabricated by the same method as Example 1, except that NPB was deposited directly on the transparent electrode (indium tin oxide) with a thickness of 1 nm and [cp3] and [cp10] were deposited thereon with a thickness of 30 to 150 nm as the hole injection or transport layer by adjusting a doping concentration of [cp3] (HOMO: approximately −5.5 eV) and [cp10] (LUMO: approximately −5.5 to −6 eV) to a volume ratio of 1:1, in Example 1.

A characteristic of a device fabricated under current density of 50 mA/cm² is shown in the following table.

| [cp3]:[cp10] Thickness (nm) | Voltage (v) | dV/dL (10⁻³ V/nm) | Operating voltage variations (%) |
|---|---|---|---|
| 30 | 10.41 | N/A | 0 |
| 60 | 11.77 | 45 | 13 |
| 90 | 14.75 | 100 | 41 |
| 120 | 16.76 | 66 | 61 |
| 150 | 17.57 | 26 | 68.8 |

(cp3:cp10 = XX nm) structure operating voltage = A, (cp3:cp10 = 30 nm) structure operating voltage = B
Operating voltage variations (%) = (A − B)/B*100

Comparative Example 5

The organic light emitting device was fabricated by the same method as Example 1, except that [cp10] (LUMO: approximately −5.5 to −6 eV) was deposited on the transparent electrode (indium tin oxide) with a thickness of 1 nm and [cp3] (HOMO: approximately −5.5 eV) was deposited thereon with a thickness of 1 nm, and [cp3] and [cp10] were deposited with a thickness of 30 nm as the hole injection or transport layer by adjusting a doping concentration of [cp3] and [cp10] to a volume ratio of 1:1, in Example 1.

Operating voltage of a device fabricated under current density of 50 mA/cm² is 11.25 V.

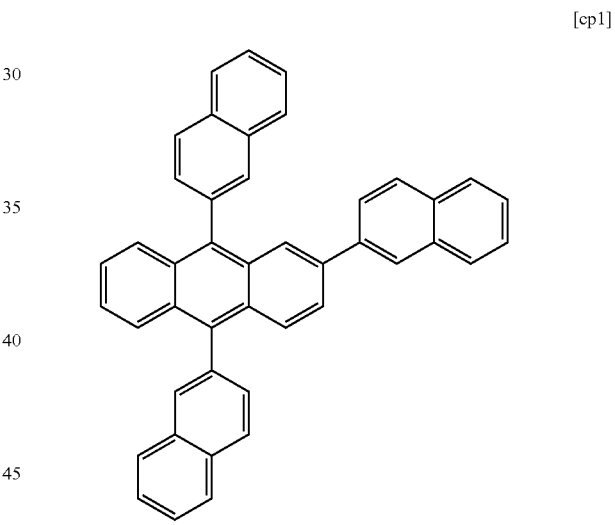

[cp1]

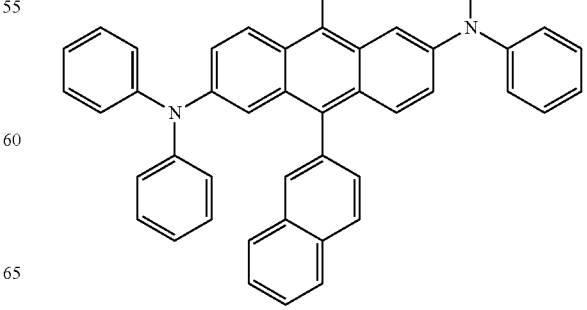

[cp2]

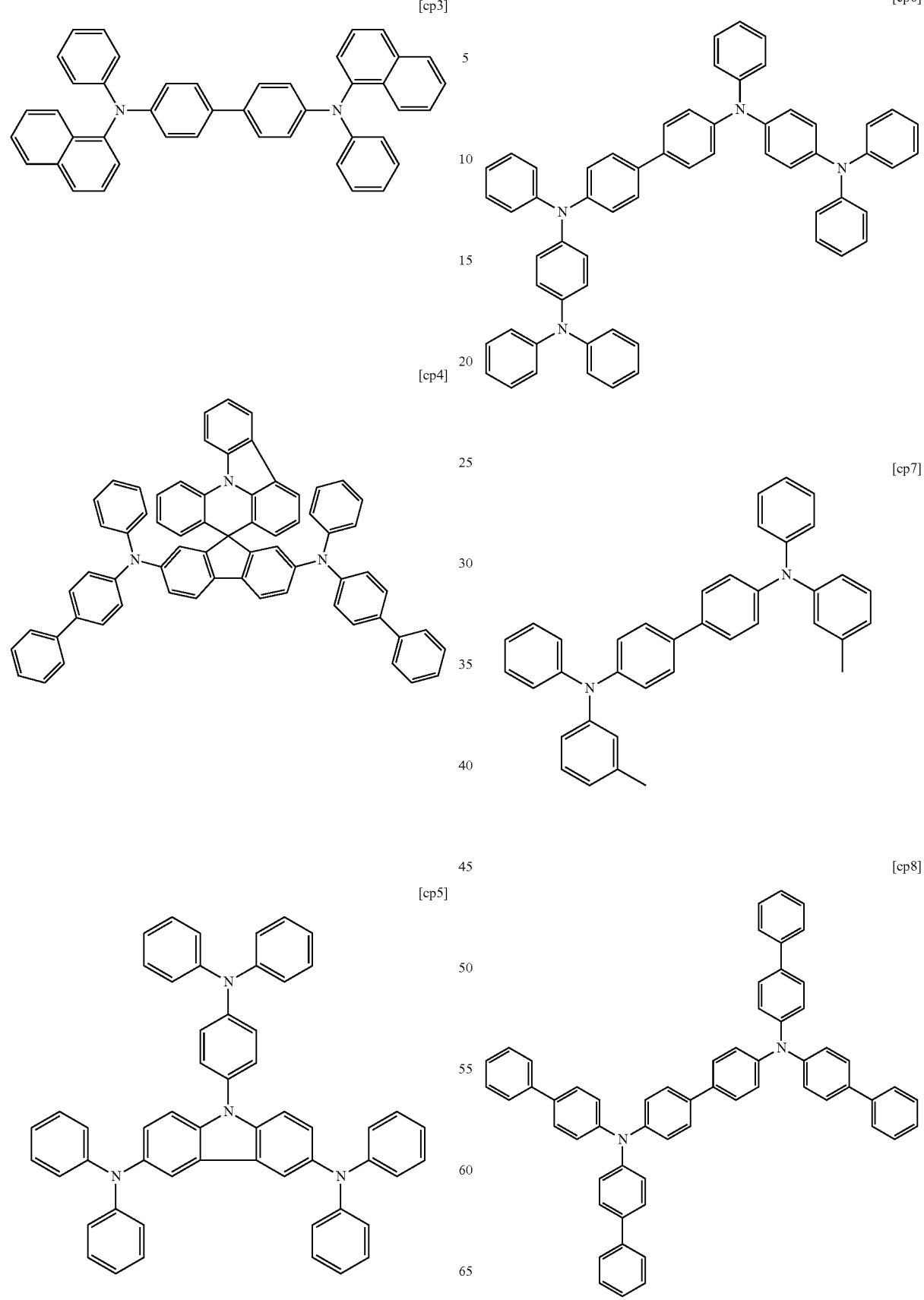

[cp9]

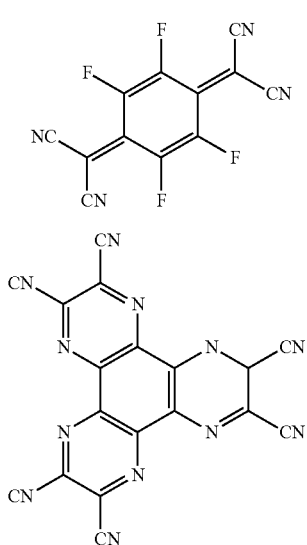

[cp10]

Through the results of Examples 1 to 9, when the hole injection or transport layer including a material having a HOMO energy level of −4 eV or lower and a material having a LUMO energy level of −4 eV or lower is formed on a layer including the material having the LUMO energy level of −4 eV or lower in the organic light emitting device, it can be seen that a device having low operating voltage in which operating voltage decreases by approximately 30% (operating voltage variations: −30%) can be implemented.

Through the result of Comparative Example 1, it can be seen that, in the case in which the hole injection or transport layer including the material having the HOMO energy level of −4 eV or lower and the material having the LUMO energy level of −4 eV or lower is formed directly on the transparent electrode, operating voltage increases as compared with the case in which the hole injection or transport layer including the material having the HOMO energy level of −4 eV or lower and the material having the LUMO energy level of −4 eV or lower is formed on the layer having the LUMO energy level of −4 eV or lower. Meanwhile, when the result of Example 2 and the results of Comparative Examples 2 and 3 are compared with each other, it can be seen that, even in the case in which the hole injection or transport layer including the material having the HOMO energy level of −4 eV or lower and the material having the LUMO energy level of −4 eV or lower is thickly formed on the layer including the material of the LUMO energy level of −4 eV or lower, a device having low operating voltage in which the increase of operating voltage is significantly suppressed is implemented. In addition, when the results of Examples 1 and 5 and the results of Comparative Examples 4 and 5 are compared with each other, it can be seen that the case in which the hole injection or transport layer including the material having the HOMO energy level of −4 eV or lower and the material having the LUMO energy level of −4 eV or lower is formed on the layer including the material having the LUMO energy level of −4 eV or lower is advantageous in low operating voltage than the case in which the hole injection or transport layer including the material having the HOMO energy level of −4 eV or lower and the material having the LUMO energy level of −4 eV or lower is formed on not the material having the LUMO energy level of −4 eV or lower but another material [cp3] (LUMO: −2.4).

Further, when the result of Example 9 and the result of Comparative Example 5 are compared with each other, it can be seen that, in the case in which the hole injection and/or layer including the material having the HOMO energy level of −4 eV or lower and the material having the LUMO energy level of −4 eV or lower is formed on the layer including the material having the LUMO energy level of −4 eV or lower in a structure in which various layers exist on the first electrode, operating voltage decreases by approximately 50% as compared with the case in which the hole injection or transport layer including the material having the HOMO energy level of −4 eV or lower and the material having the LUMO energy level of −4 eV or lower is formed without the material having the LUMO energy level of −4 eV or lower.

The invention claimed is:

1. An organic light emitting device comprising
a first electrode,
a second electrode and
two or more organic layers including an emission layer disposed between the two electrodes,
wherein the organic layers comprises a first hole injection or transport layer including a material having a LUMO energy level of −4 eV or lower and a second hole injection or transport layer including a material having a HOMO energy level of −4 eV or lower and a material having a LUMO energy level of −4 eV or lower, which is in contact with the first hole injection or transport layer,
wherein the light emitting device further comprises a layer including a material having a LUMO energy level of −4 eV or lower and a layer including a material having a HOMO energy level of −4 eV or lower,
wherein the layer including the material having the LUMO energy level of −4 eV or lower; the layer including the material having the HOMO energy level of −4 eV or lower; the first hole injection or transport layer; and the second hole injection or transport layer are provided in sequence between the first electrode and the emission layer, and
wherein the material having the LUMO energy level of −4 eV or lower includes one or more materials selected from the group consisting of fluorine-substituted 3,4,9,10-perylene tetracarboxylic dianhydride (PTCDA), cyano-substituted PTCDA, naphthalene tetracarboxylic dianhydride (NTCDA), fluorine-substituted NTCDA, cyano-susbstituted NTCDA, hexanitrilehexaazatriphenylene (HAT) and hexaazatriphenylenehexacarbonitrile.

2. The organic light emitting device of claim 1, further comprising at least one organic layer between the second hole injection or transport layer and the emission layer.

3. The organic light emitting device of claim 1, further comprising one or more layers selected from an electron transport layer, an electron injection layer, a hole or electron blocking layer and a buffer layer between the emission layer and the second electrode.

4. The organic light emitting device of claim 1, wherein the thickness of the first hole injection or transport layer is 0.1 to 100 nm and the thickness of the second hole injection or transport layer is 1 to 1000 nm.

5. The organic light emitting device of claim 1, wherein the material having the HOMO energy level of −4 eV or lower includes an organic material having one or two or more functional groups selected from the group consisting of an amine group, a carbazole group and a thiophene group.

6. The organic light emitting device of claim 1, wherein the material having the HOMO energy level of −4 eV or lower has a HOMO energy level of −9 eV or higher.

7. The organic light emitting device of claim 1, wherein the material having the LUMO energy level of −4 eV or lower has a LUMO energy level of −9 eV or higher.

8. The organic light emitting device of claim 1, wherein the emission layer includes at least one of fluorescent dopant or phosphorescent dopant.

9. The organic light emitting device of claim 1, wherein at least one of the first hole injection or transport layer and the second hole injection or transport layer further includes an inorganic material.

10. The organic light emitting device of claim 9, wherein the inorganic material is metal or metal oxide.

11. The organic light emitting device of claim 9, wherein the inorganic material has a work function of 2.5 eV to 6 eV.

12. The organic light emitting device of claim 1, wherein the organic light emitting device has a normal structure in which a hole injection electrode, an organic layer of two or more organic layers including the emission layer and an electron injection electrode are layered in sequence from the bottom.

13. The organic light emitting device of claim 1, wherein the organic light emitting device has an inverted structure in which an electron injection electrode, an organic layer of two or more organic layers including the emission layer and a hole injection electrode are layered in sequence from the bottom.

14. A stacked organic light emitting device comprising
a first electrode,
a second electrode and
at least two light emitting units disposed between the two electrodes,
wherein the light emitting unit includes an emission layer, a first injection or transport layer including a material having a LUMO energy level of −4 eV or lower and a second hole injection or transport layer including a material having a HOMO energy level of −4 eV or lower and a material having a LUMO energy level of −4 eV or lower, which is in contact with the first hole injection or transport layer,
wherein the stacked light emitting device further comprises a layer including a material having a LUMO energy level of −4 eV or lower and a layer including a material a HOMO energy level of −4 eV or lower,
wherein the layer including the material having the LUMO energy level of −4 eV or lower; the layer including the material having the HOMO energy level of −4 eV or lower; the first hole injection or transport layer; and the second hole injection or transport layer are provided in sequence between the first electrode and the emission layer, and
wherein the material having the LUMO energy level of −4 eV or lower includes one or more materials selected from the group consisting of fluorine-substituted 3,4,9,10-perylene tetracarboxylic dianhydride (PTCDA), cyano-substituted PTCDA, naphthalene tetracarboxylic dianhydride (NTCDA), fluorine-substituted NTCDA, cyano-susbstituted NTCDA, hexanitrilehexaazatriphenylene (HAT) and hexaazatriphenylenehexacarbonitrile.

15. The stacked organic light emitting device of claim 14, wherein an intermediate conductive layer or a charge generating layer is further provided between the light emitting units.

16. A process for preparing an organic light emitting device of claim 1, comprising the steps of:
preparing a first electrode;
forming at least two organic material layers including a light emitting layer on the first electrode; and forming a second electrode on the organic material layers,
wherein the step of forming the organic material layers comprises the step of forming a first hole injection or transport layer including a material having a LUMO energy level of −4 eV or lower and forming a second injection or transport layer including a material having a HOMO energy level of −4 eV or lower and a material having a LUMO energy level of −4 eV or lower, which is in contact with the first hole injection or transport layer,
wherein the step of forming the organic material layers further comprises the step of forming a layer including a material having a LUMO energy level of −4 eV or lower and a layer including a material having a HOMO energy level of −4 eV or lower between the first hole injection or transport layer and the first electrode,
wherein the layer including the material having the LUMO energy level of −4 eV or lower; the layer including the material having the HOMO energy level of −4 eV or lower; the first hole injection or transport layer; and the second hole injection or transport layer are provided in sequence between the first electrode and the emission layer, and
wherein the material having the LUMO energy level of −4 eV or lower includes one or more materials selected from the group consisting of fluorine-substituted 3,4,9,10-perylene tetracarboxylic dianhydride (PTCDA), cyano-substituted PTCDA, naphthalene tetracarboxylic dianhydride (NTCDA), fluorine-substituted NTCDA, cyano-susbstituted NTCDA, hexanitrilehexaazatriphenylene (HAT) and hexaazatriphenylenehexacarbonitrile.

17. The process for preparing an organic light emitting device according to claim 16, wherein the step of forming the first hole injection or transport layer or the second hole injection or transport layer is carried out by spin coating, dip coating, doctor blading, screen printing, ink jet printing, or heat transfer processes.

* * * * *